United States Patent [19]

Isu et al.

[11] Patent Number: 5,651,073
[45] Date of Patent: Jul. 22, 1997

[54] AUTOMATIC LEVEL CONTROL CIRCUIT FOR RESTRICTING SOUND LEVEL

[75] Inventors: Kenji Isu; Yasushi Adachi, both of Tokyo, Japan

[73] Assignee: Mitsubishi Denki Kabushiki Kaisha, Tokyo, Japan

[21] Appl. No.: 566,911

[22] Filed: Dec. 4, 1995

[30] Foreign Application Priority Data

Jul. 17, 1995 [JP] Japan .................. 7-180122

[51] Int. Cl.$^6$ .................................................. H03G 3/00
[52] U.S. Cl. .............................. 381/108; 330/86; 330/284
[58] Field of Search ............................. 455/245.1, 250.1; 341/139; 330/86, 284; 381/107, 108, 106

[56] References Cited

U.S. PATENT DOCUMENTS

| | | | |
|---|---|---|---|
| 4,553,105 | 11/1985 | Sasaki | 455/250.1 |
| 4,718,119 | 1/1988 | Salzer et al. | 455/245.1 |
| 5,045,809 | 9/1991 | Cho | 330/284 |

*Primary Examiner*—Forester W. Isen
*Attorney, Agent, or Firm*—Leydig, Voit & Mayer

[57] ABSTRACT

The invention provides an automatic level control circuit which restricts and outputs a large input voice level received from microphone without causing the large input voice level to saturate when a microphone is used in a sound generating device such as a ka-ra-o-ke set. An automatic level control circuit includes a first potential divider comprising an automatic level control circuit for restricting sound level. The first potential divider includes a first resistor and a first transistor, where one end terminal of the first resistor is connected to an input terminal. An amplifier is connected to a connection point of the first resistor and the first transistor of said first potential divider and a second potential divider is provided. The second potential divider includes a second resistor and a second transistor connected to an output terminal of said amplifier. A voltage comparator includes a plus terminal which is connected to a connection point of the second resistor and the second transistor of the second potential divider, and a minus terminal that is connected to a reference voltage. A charging/discharging circuit includes an input that is connected to an output of the voltage comparator, and an output that is connected to a gate terminal of the first and second transistors.

6 Claims, 9 Drawing Sheets

AUTOMATIC LEVEL CONTROL CIRCUIT FOR RESTRICTING SOUND LEVEL

BACKGROUND OF THE INVENTION

1. Field of the Invention

The invention relates to an automatic level control circuit for restricting sound level received from a microphone when the microphone is used in a sound generating device such as a ka-ra-o-ke set. More particularly, it relates to an automatic level control circuit wherein the output level does not saturate even if a sound level received from the microphone exceeds a certain threshold level and therefore the output level changes in response to an input level.

2. Description of the Prior Art

Figure 7:
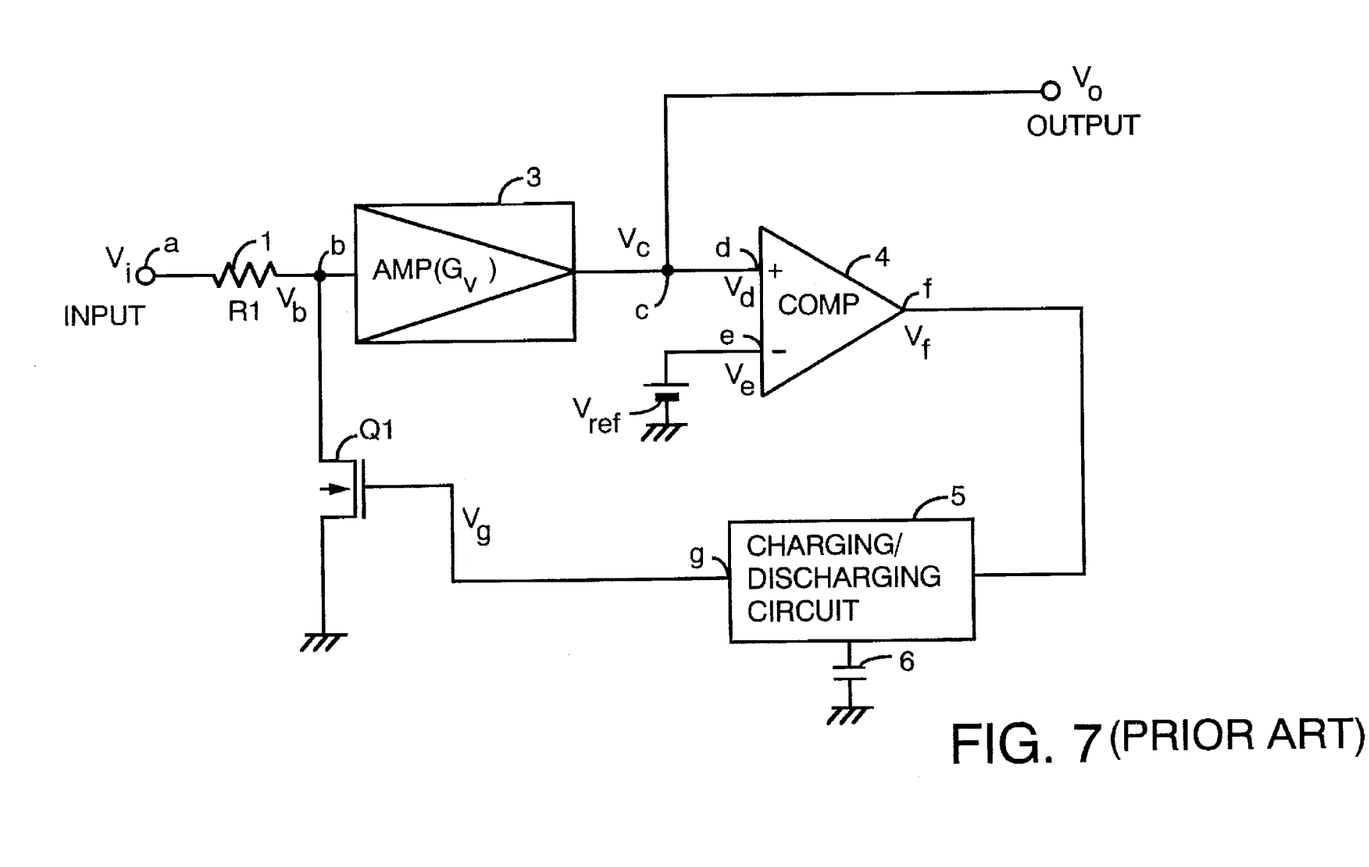
FIG. 7 shows a conventional automatic level control circuit.

FIG. 7 shows a conventional automatic level control circuit. FIG. 8 shows characteristics of each point (a~g) of the conventional automatic level control circuit in FIG. 7. Note that scales of vertical axis in FIG. 8A~FIG. 8H are not the same. In the past, if a microphone input exceeded a predetermined threshold level when using a circuit configuration like that of FIG. 7, an input level of amplifier is restricted in order to reduce a distortion. Therefore, an output level of amplifier has been restricted to that purpose. With reference to FIG. 7 and FIG. 8, the operation of the conventional automatic level circuit is explained below.

An input voltage Vi (FIG. 8A) is amplified by a predetermined quantity in the amplifier and outputted to the output terminal. When output Vo of the amplifier becomes equal to or more than a threshold level Vit, distortions of amplifier output increases sharply and the output characteristics become worse. Accordingly the input voltage is divided by a resistor 1 and an N channel transistor Q1 (referred to "transistor Q1" below) so that the output Vo of the amplifier is restricted to a value less than the reference voltage Vref. In this case, the output voltage Vo is represented using an input threshold voltage Vit and gain Gv of the amplifier as follows.

$$Vo = Vref = Gv \cdot Vit$$

Figure 8A:
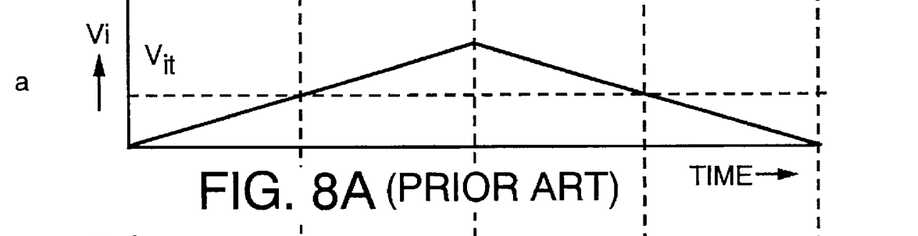
FIGS. 8A, 8B, 8C, 8E, 8G, and 8H show characteristics of each point of the conventional automatic level control circuit.
Figure 8B:
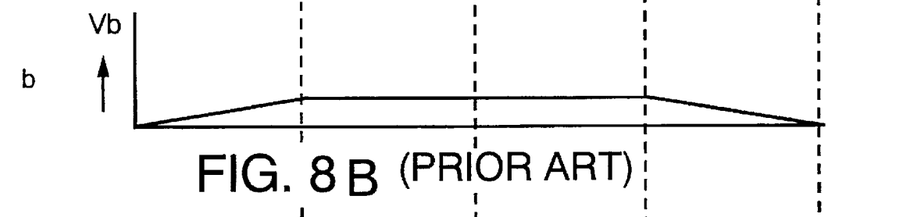
Figure 8C:
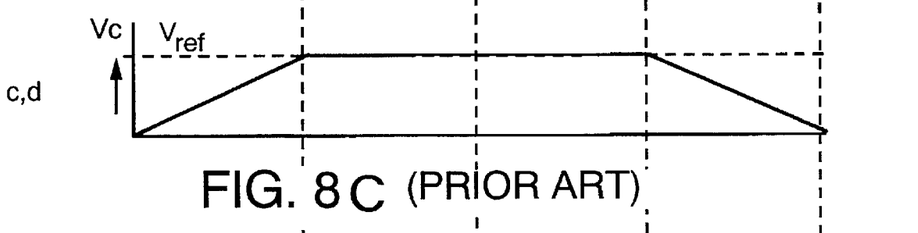
Figure 8E:
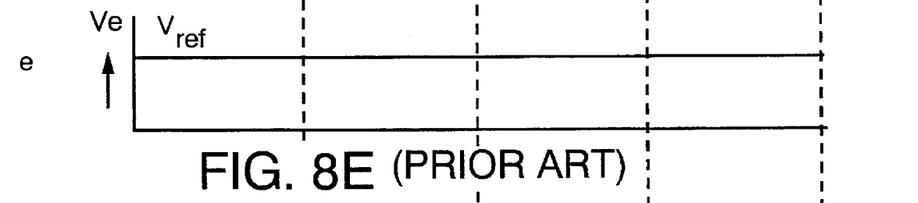
Figure 8G:
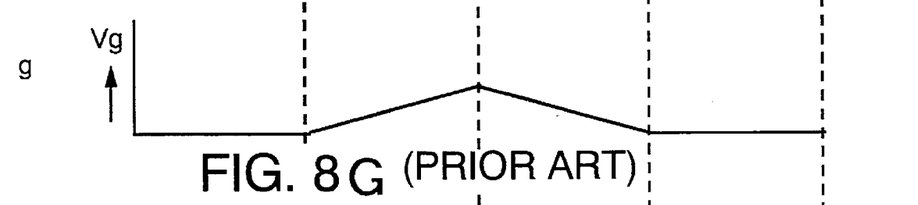
Figure 8H:
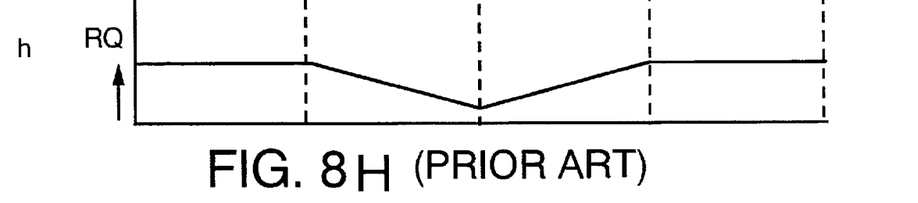

In other words, when input voltage Vi exceeds the input threshold level Vit, the input voltage Vi is divided by resistor R1 and transistor Q1, and thus voltage Vb applied to the input terminal "b" of amplifier 3 becomes constant (FIG. 8B). For this reason, output voltage Vc of amplifier 3 becomes constant at the point where input voltage Vi exceeds threshold level Vit (FIG. 8C). The output of this amplifier 3 is inputted to voltage comparator 4 to be compared with reference voltage Vref (FIG. 8C). The output of voltage comparator 4 controls a gate voltage Vg (FIG. 8G) of transistor Q1 through a charging/discharging circuit 5. The transistor Q1 controls the input voltage of amplifier 3 by dividing input voltage Vi using resistor 1 and transistor Q1. FIG. 8H shows a resistance value QR1 of transistor Q1. The resistor value RQ is inverse proportional to the gate voltage Vg as described in detail below.

Figure 9:
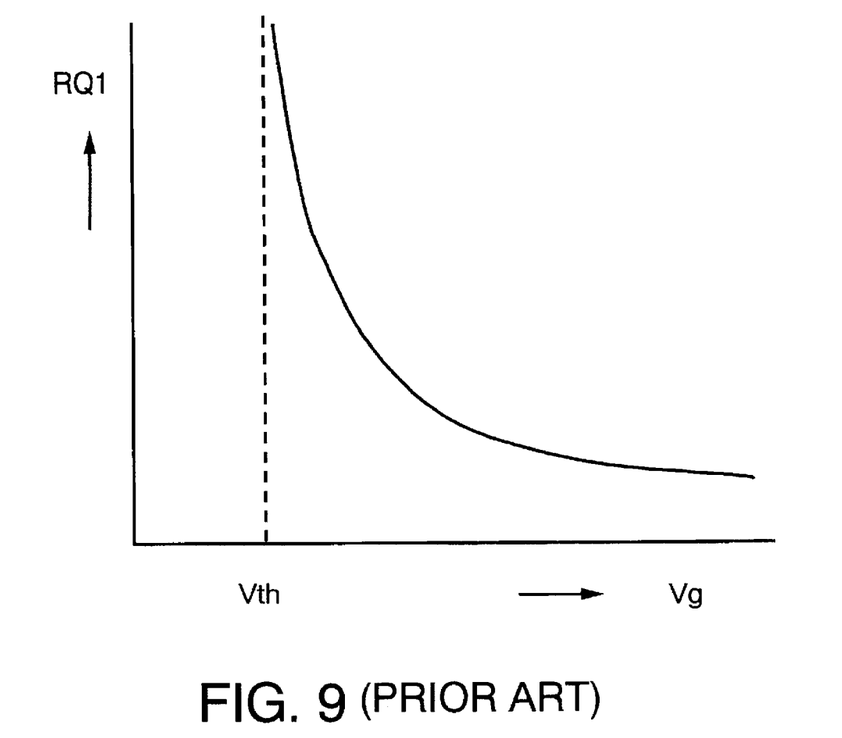
FIG. 9 shows RQ1 versus Vg characteristics of N channel transistor.

FIG. 9 shows RQ1 versus Vg characteristics of N channel transistor. As shown in FIG. 9, N channel transistor operates such that when gate voltage Vg increases, resistance RQ1 between drain-source decreases. Since this N channel transistor is connected to resistor 1 so as to constitute a series circuit, if gate voltage Vg (FIG. 8G) increases, as understood from FIG. 9, a resistance value RQ1 of the resistor Q1 becomes small, and thereby the input voltage into amplifier 3 becomes small as a result.

Figure 10:
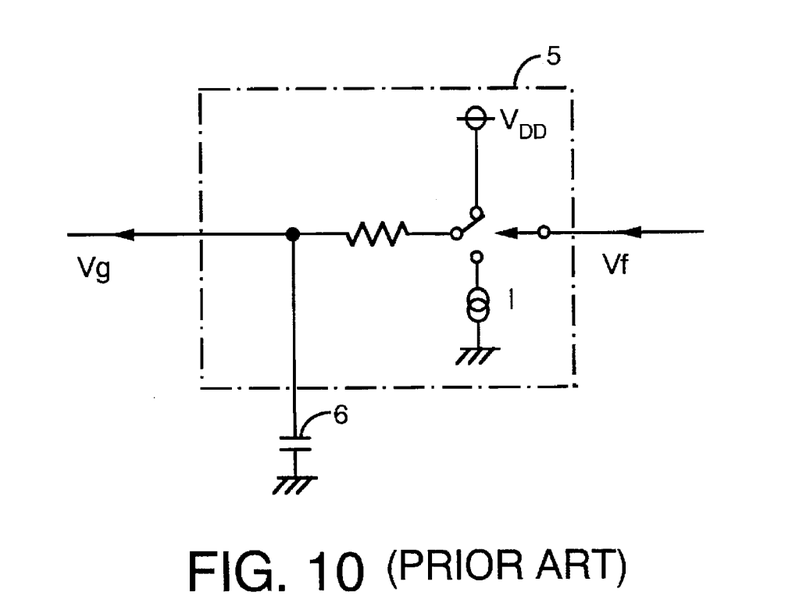
FIG. 10 shows a detailed circuit diagram of a charging/discharging circuit.

FIG. 10 shows a detailed circuit diagram of a charging/discharging circuit 5. In FIG. 7, when plus side input voltage Vd of voltage comparator (COMP) 4 is larger than minus side input voltage Ve, an output voltage Vf of voltage comparator 4 becomes "H" level, which causes switching point in FIG. 10 to connect to power source $V_{DD}$, which charges capacitor 6. Therefore, output voltage Vg of charging/discharging circuit 5 becomes higher. Alternatively, when plus side input voltage Vd is smaller than minus side input voltage Ve, the output voltage Vf of voltage comparator 4 becomes "L", which causes switching point in FIG. 10 to connect to constant current source I, which discharges capacitor 6. Therefore, output voltage Vg of charging/discharging circuit 5 becomes low. In this way, charging and discharging of capacitor 6 are repeated for many times, then output voltage Vg of charging/discharging circuit 5 finally makes a curve as shown in FIG. 8G which has a similar shape to that of the input voltage Vi for regions over the threshold level Vit.

Next, an operation of a circuit of FIG. 7 is explained in detail using FIG. 8. In case that output voltage Vo (=Vc) of amplifier 3 is lower than reference voltage Vref, that is, Vo<Vref, the output voltage Vf of voltage comparator 4 becomes 0 [V], therefore, capacitor 6 is discharged in charging/discharging circuit 5 and then gate voltage (FIG. 8G) of N channel transistor Q1 becomes low as described above. Accordingly, ON- resistance RQ1 (FIG. 8H) of transistor Q1 becomes large, which gives a larger voltage to resistance RQ1 of transistor Q1 than resistor 1 in the divider. Thereby, the input voltage to amplifier 3 becomes large. On the other hand, in case of Vo>Vref, output voltage Vg of charging/discharging circuit 5 corresponds to input voltage Vi as described above, and thereby, ON-resistance RQ1 (FIG. 8H) of the transistor Q1 becomes small, which gives a small voltage to resistance RQ1 of transistor Q1 than resistor 1 in the divider. Thereby, the input voltage to amplifier 3 becomes small.

The above-mentioned relationship between output voltage Vo and input voltage Vi of the circuit of FIG. 7 is represented in the following formula (1).

$$Vo = Vc = Vi\{RQ1/(R1+RQ1)\} \cdot Gv \quad (1)$$

where, R1: resistance value of resistor 1, RQ1: ON-resistance value of N channel transistor Q1, Gv: amplification factor of amplifier 3.

In case of Vi·Gv<Vref, in other words, when input voltage Vi is small, the value of Vo is almost equal to Vi·Gv. This is due to R1<<RQ1. Still, in case of Vi·Gv>Vref, in other words, when the input voltage Vi is large, the circuit operates so that the plus side input and the minus side input of voltage comparator 4 becomes ultimately the same value (Vo=Vref). Therefore, output voltage Vo is controlled not to exceed the reference voltage Vref as shown in FIG. 8C. In other words, in the portion where Vi exceeded the threshold Vit, output voltage Vc of amplifier 3 becomes constant.

When a microphone is used for a ka-ra-o-ke set, it is frequently used in a state that a microphone output is at a very large level, that is, in a range of Vi·Gv>Vref, where Vi is an input voltage, Gv is amplification factor and Vref is reference voltage. In case of Vi·Gv>Vref, an output of amplifier becomes constant, as described above. In other words, the output voltage of amplifier is saturated as illustrated in FIG. 8C. From this reason, in the range where an input level from a microphone is large, there is a problem that a sense of incongruity resulted from saturation of the output signal occurs. That is, the saturation of the output signal results in that less difference of the output level from the amplifier occurs even if the input level is considerably changed.

It is an object of the present invention to provide an automatic level control circuit which eliminates a sense of incongruity caused from sound volume saturation in the range (Vd=Vi·Gv>Vref) where an output voltage Vo level of the amplifier is saturated. This is attained by restricting a large input voice level received from microphone but by outputting it in response to the input voice level.

SUMMARY OF THE INVENTION

According to one aspect of the invention, an automatic level control circuit comprises a first potential divider comprising a first resistor and a first transistor, one end terminal of said resistor is connected to an input terminal; an amplifier connected to a connection point of the first resistor and the first transistor; a second potential divider comprising a second resistor and a second transistor connected to an output terminal of said amplifier; a voltage comparator whose plus terminal is connected to a connection point of said second resistor and second transistor of said second potential divider, and whose minus terminal is connected to a reference voltage; and a charging/discharging circuit whose input is connected to an output of said voltage comparator, and whose output is connected to a gate terminal of said first and second transistors.

According to another aspect of the invention, an automatic level control circuit comprises a first potential divider comprising a first transistor and a first resistor, one end terminal of said resistor is connected to an input terminal; an amplifier connected to a connection point of the first resistor and the first transistor of said first potential divider; a voltage comparator whose plus terminal is connected to an output terminal of said amplifier, and whose minus terminal is connected to a connection point of a third resistor and a reference voltage source of a third potential divider which comprises said third resistor, said reference voltage source and a third transistor; and a charging/discharging circuit whose input is connected to an output of said voltage comparator, and whose output is connected to a gate terminal of said first and third transistors.

According to further aspect of the invention, an automatic level control circuit comprises a first potential divider comprising a first transistor and a first resistor, one end terminal of said resistor is connected to an input terminal; an amplifier connected to a connection point of the first resistor and the first transistor of said first potential divider; a second potential divider comprising a second resistor and a second transistor, one end terminal of said resistor is connected to an output terminal of said amplifier; a voltage comparator whose plus terminal is connected to a connection point of said second resistor and second transistor of an output of said amplifier;, and whose minus terminal is connected to a connection point of a third resistor and a reference voltage source of a third potential divider which comprises said third resistor, said reference voltage source and a third transistor; and a charging/discharging circuit whose input is connected to an output of said voltage comparator, and whose output is connected to a gate terminal of said first and third transistors.

DETAILED DESCRIPTION OF PREFERRED EMBODIMENTS

Embodiment 1

Figure 1:
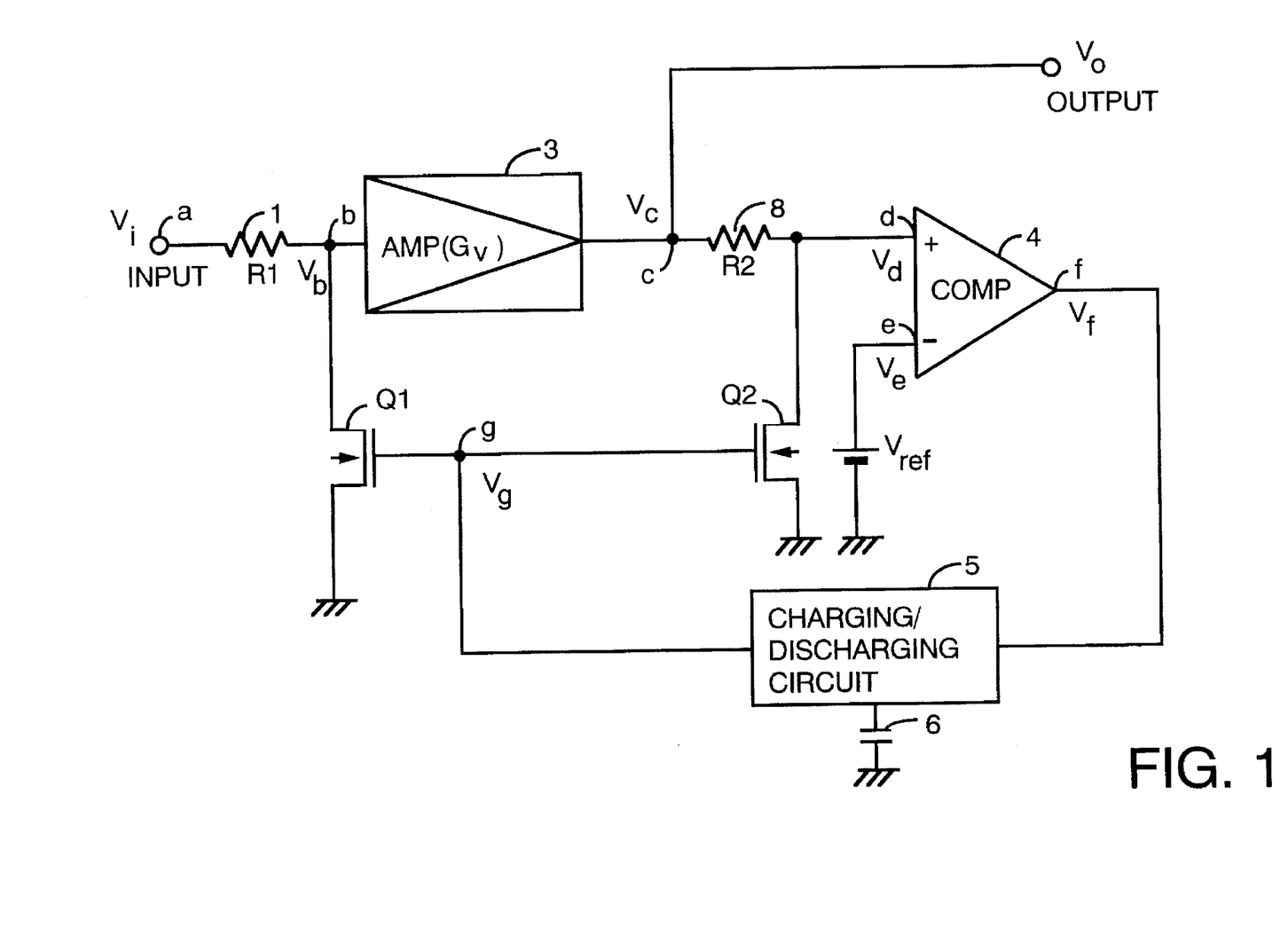
FIG. 1 shows an automatic level control circuit of a first embodiment of the present invention.

FIG. 1 shows an automatic level control circuit of a first embodiment of the present invention. FIG. 2 shows characteristics of each point (a~g) of the automatic level control circuit of the first embodiment of the present invention. Note that scales of vertical axis in FIG. 2A~FIG. 2H are not the same. An operation of the automatic level control circuit of the first embodiment of the present invention is explained using FIG. 1 and FIG. 2.

Figures 2A, 2B:
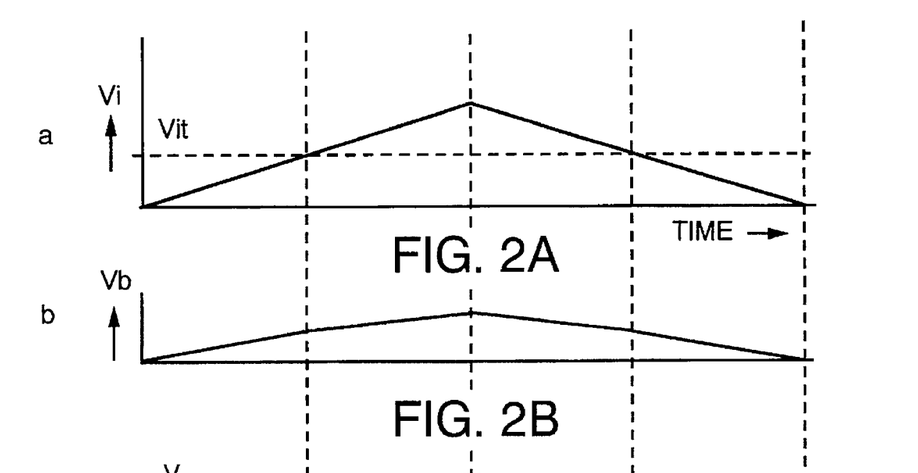
FIGS. 2A, 2B, 2C, 2D, 2E, 2G, and 2H show characteristics of each point of the automatic level control circuit of the first embodiment of the present invention.
Figures 2C, 2D:
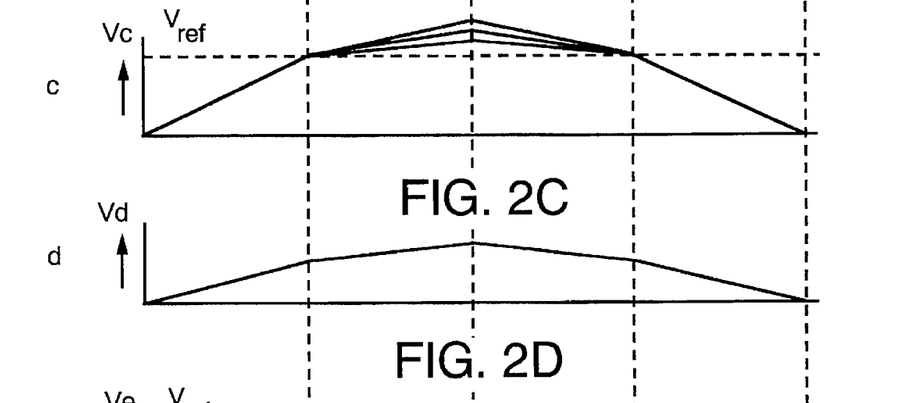
Figures 2E, 2G:
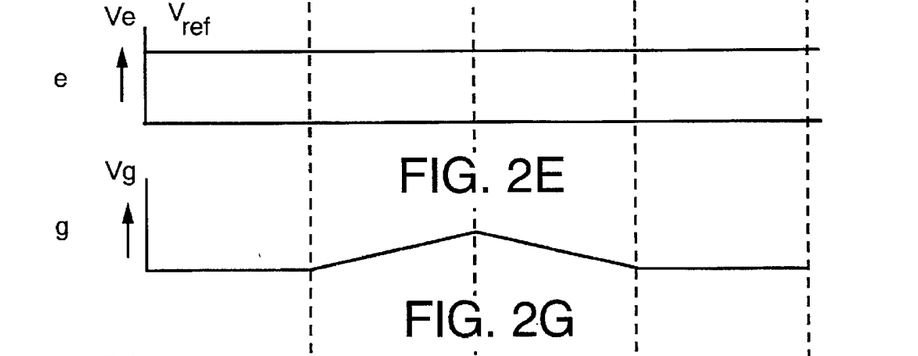
Figure 2H:
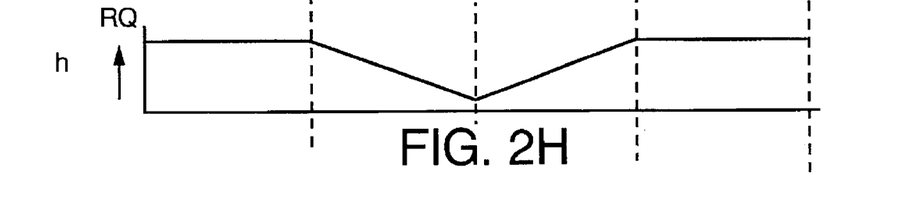

An input voltage Vi (FIG. 2A) is divided by resistor 1 and resistance QR1 of transistor Q1, and inputted into amplifier 3 (FIG. 2B). The output of amplifier 3 (FIG. 2C) is inputted into the second potential divider constituted of resistor 2 and resistance QR2 of transistor Q2. The output (FIG. 2D) of the second potential divider 2 is inputted into voltage comparator 4 to be compared with reference voltage Vref. Output Vf of voltage comparator 4 controls gate voltage (FIG. 2G) of N channel transistors Q1 and Q2 through charging/discharging circuit 5. The gate voltage (FIG. 2G) changes respective division ratios of the first and second potential dividers, thereby, input voltages to amplifier 3 and to voltage comparator 4 are controlled (FIG. 2B, 2D). FIG. 2H shows a resistance value QR1 of transistor Q1. The resistor values RQ1, RQ2 are inverse proportional to the gate voltage Vg as described in detail below.

FIG. 1 has an advantage where resistor 8 and N channel transistor Q2 are arranged between amplifier 3 and voltage comparator 4 in addition to a conventional circuit. Gate voltage Vg (FIG. 2G) of N channel transistor Q2 is controlled by charging/discharging circuit 5 and it operates similar to that of the conventional N channel transistor Q1. Output Vo of amplifier 3 inputted into the plus side input terminal of voltage comparator 4 is divided by resistor 8 and N channel transistor Q2. Voltage Vd inputted into the plus terminal of voltage comparator 4 is obtained in the formula below:

$$Vd = Vo\{RQ2/(R2+RQ2)\} \quad (2)$$

where, R2 is resistance value of resistor 8 and RQ2 is ON-resistance value of N channel transistor Q2. An attenuation ratio RQ2/(R2+RQ2) for output voltage Vo of amplifier 3 defined by resistor Q2 and ON-resistance value RQ2 of transistor Q2, and an attenuation ratio RQ1/(RI+RQ1) for input voltage Vi defined by R1 and ON-resistance value RQ1 are designed so that they satisfy the following formula.

$$RQ1/(R1+RQ1)=n\{RQ2/(R2+RQ2)\} \qquad (3)$$

In this system, an output voltage does not exceed reference voltage Vref. In other words, in case of Vi·Gv<Vref, since output voltage Vf of voltage comparator 4 is earth potential, the relations R1<<RQ1 and R2<<RQ2 are satisfied as described above, and therefore, RQ1/(Ri+RQ1)=RQ2/(R2+RQ2)=1. As a result, Vo becomes almost equal to Vi·Gv according to formula (1). On the other hand, if an output voltage exceeds reference voltage Vref, in other words, in case of Vi·Gv>Vref, the system operates so that the plus side input voltage and the minus side input voltage of voltage comparator 4 become equal. Therefore, relationships such as shown in the following formulas (4) and (5) are obtained.

$$Vo=Vi\{RQ1/(R1+RQ1)\}\cdot Gv \qquad (4)$$

$$Vref=Vo\{RQ2/(R2+RQ2)\} \qquad (5)$$

The output voltage Vo is given in a following formula (6) from formulas (2), (3) and (4):

$$Vo=SQR(n\cdot Vref\cdot Gv\cdot Vi) \qquad (6)$$

where, SQR stands for a sign of square root.

It is concluded from the formula (6) that output voltage Vo is in proportion to a square root of input voltage Vi in the range of Vi·Gv>Vref, and therefore Vo varies depending on a value of Vi. Further, a variation quantity can be changed by changing the value of "n".

As described above, characteristics between input and output of automatic level control circuit of the first embodiment are shown in FIG. 2C. In the range where an output voltage Vo does not exceed the reference voltage Vref, a signal of Vi·Gv is outputted, which means that an input voltage Vi is amplified by the amplification factor Gv in amplifier 3. In the range where an output voltage Vo exceeds a reference voltage Vref, the voltage level is restricted so that an output voltage of the amplifier does not saturate. Alternatively, a voice level, which is proportional to the square root of input signal Vi and Gv, can be outputted as shown in formula (6). Thereby, it is possible to decrease a sense of incongruity resulted from saturation of the output signal which is derived from a large input signal.

Embodiment 2

Figure 3:
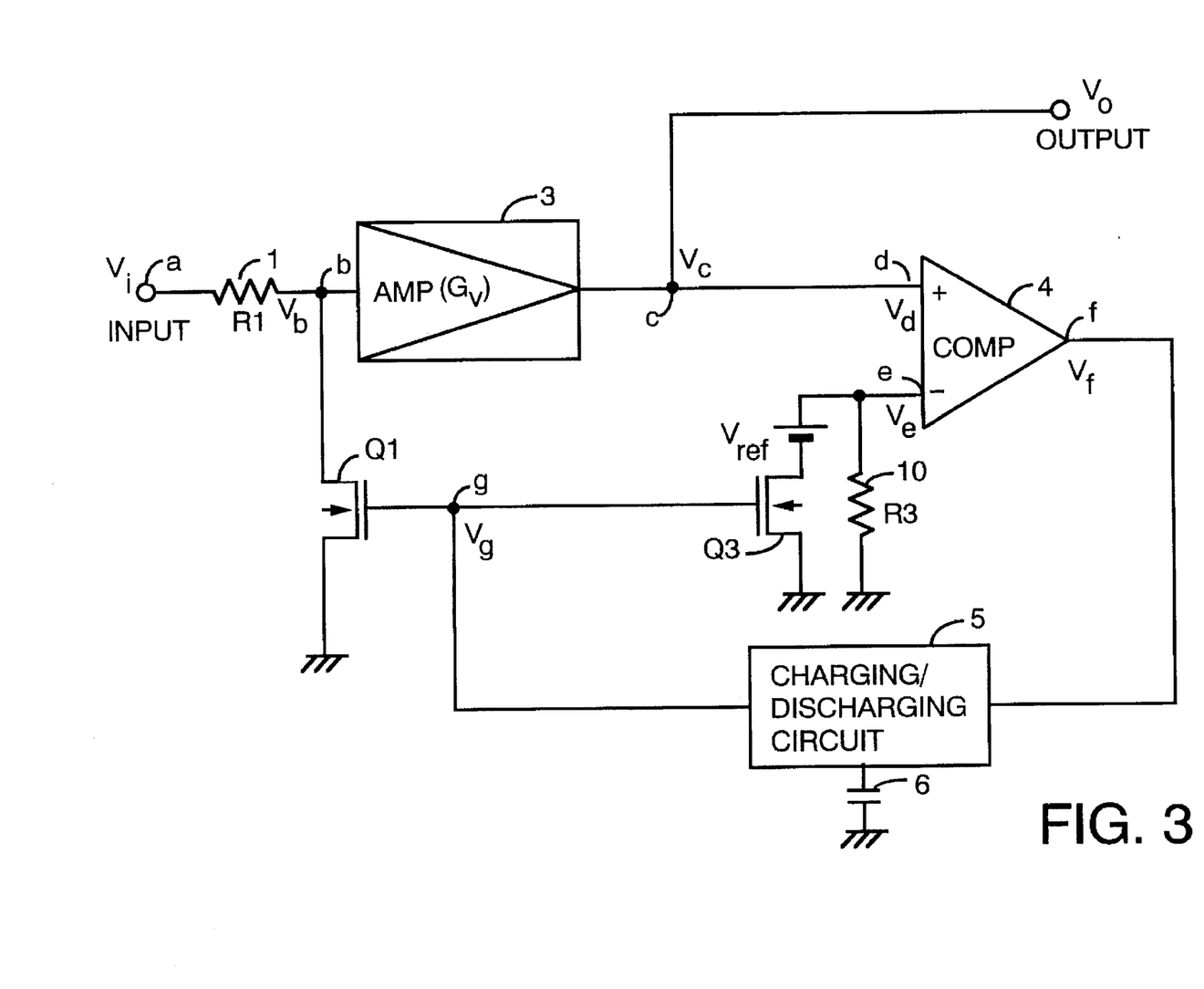
FIG. 3 shows an automatic level control circuit of a second embodiment of the present invention.

FIG. 3 shows an automatic level control circuit of a second embodiment of the present invention. FIG. 4 shows characteristics of each point (a~g) of the automatic level control circuit of the second embodiment of the present invention. Note that scales of vertical axis in FIG. 4A ~FIG. 4G are not the same. An operation of the automatic level control circuit of the second embodiment of the present invention is explained using FIG. 3 and FIG. 4.

FIG. 3 has an advantage where resistor 10 is connected to N channel transistor Q3 in parallel at the minus side input of voltage comparator 4. Gate voltage Vg (FIG. 4G) of N channel transistor Q2 is controlled by charging/discharging circuit 5 and it operates similar to that of the conventional N channel transistor Q1. Voltage Ve (FIG. 4E) inputted on the minus side input of voltage comparator 4 is divided by resistance R3 of the resistor 10 and ON-resistance RQ3 of N channel transistor Q3. Voltage Ve is obtained as shown in the following formula (7).

$$Ve=\{R3/(R3+RQ3)\}\cdot Vref \qquad (7)$$

where, R3 is resistance value of resistor 10 and RQ3 is ON-resistance value of N channel transistor Q3. Voltage comparator 4 operates so that the plus side input voltage and the minus side input voltage become the same value. Thereby output voltage Vo of this automatic level control circuit is expressed in a formula (8).

$$Vc=Vd=Vo=\{R3/(R3+RQ3)\}\cdot Vref \qquad (8)$$

As illustrated in FIG. 9, the smaller the gate voltage Vg (FIG. 4G) is, the larger ON-resistance RQ3 of N channel transistor Q3 becomes, and the larger the gate voltage Vg (FIG. 4G) is, the smaller ON-resistance RQ3 of N channel transistor Q3 becomes. Thereby, the comparison voltage Ve (FIG. 4E) varies depending on value of gate voltage Vg. The characteristics of such circuit are considered by separating to the following three ranges.

(1) In case of Vi·Gv<Vref, in other words, R1<<RQ1 and R3<<RQ3 (Vi is a small signal), then Vo is obtained such as Vo=0.

(2) In case of Vi Gv>Vref, R1 is almost equal to RQ1 and R3 is almost equal to RQ3 (Vi is a middle signal), then Vo is substantially obtained such as Vi·Gv/2=Vref/2.

(3) In case of Vi·Gv>Vref, R1>>RQ1 and R3>>RQ3 (Vi is a large signal), then Vo is substantially obtained such as Vref.

Figure 4A:
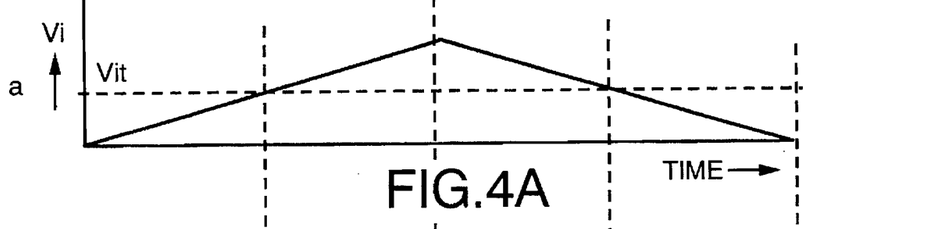
FIGS. 4A, 4B, 4C, 4E, and 4G show characteristics of each point of the automatic level control circuit of the second embodiment of the present invention.
Figure 4B:
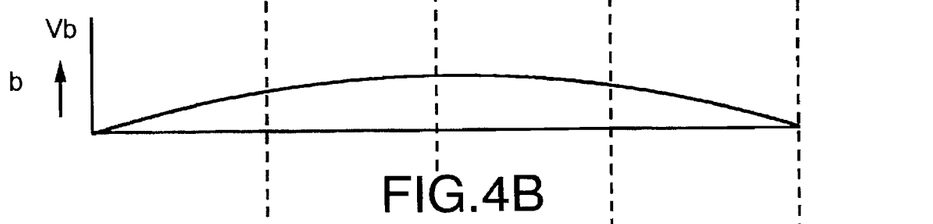
Figure 4C:
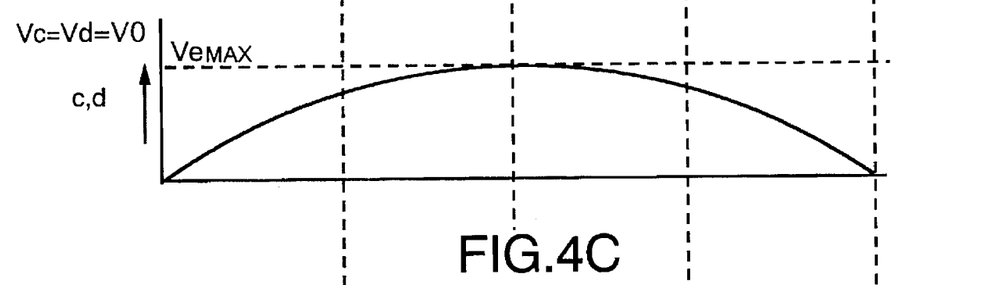
Figure 4E:
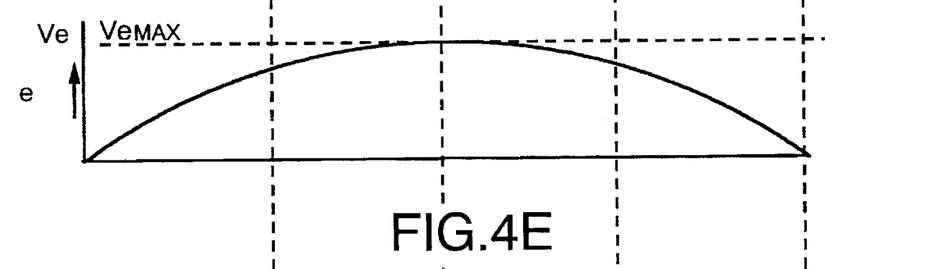
Figure 4G:
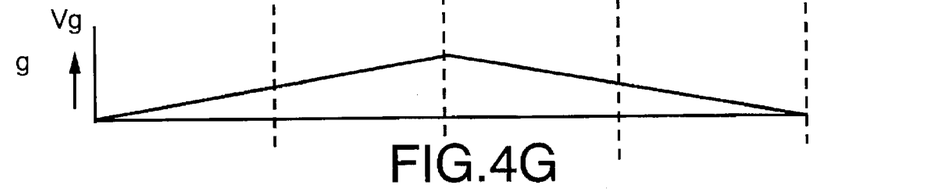

As described above, if the above-mentioned three regions are connected, input versus output characteristics of the automatic level control circuit are represented by a smoothed curve across the whole range as shown in FIG. 4C. As a result, an appropriate amount of voice level is obtained across the whole range, and the maximum output voltage is restricted to a value of Vref even if a large signal level is inputted, and therefore the output voltage is prevented from being saturated.

Further, it is possible to change the curve characteristics by changing value of "n" in the following formula.

$$RQ1/(R1+RQ1)=n\{R3/(R3+RQ3)\} \qquad (9)$$

Embodiment 3

Figure 5:
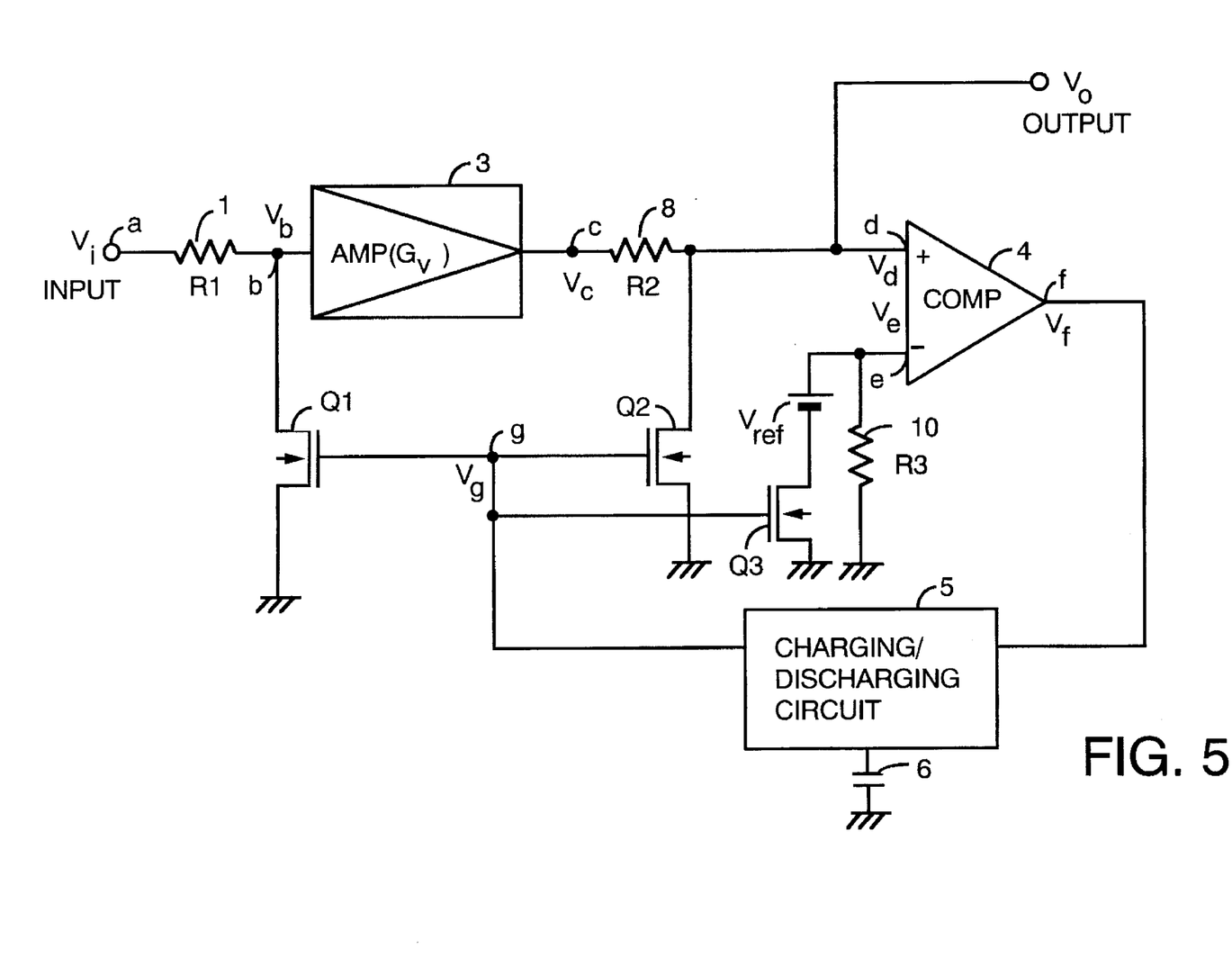
FIG. 5 shows an automatic level control circuit of a third embodiment of the present invention.
Figure 6A:
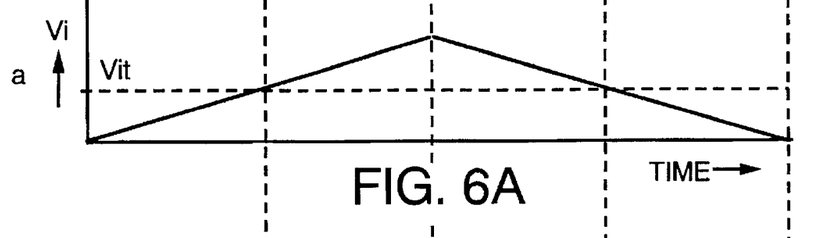
FIGS. 6A, 6B, 6C, 6E, and 6G show characteristics of each point of the automatic level control circuit, of the third embodiment of the present invention.
Figure 6B:
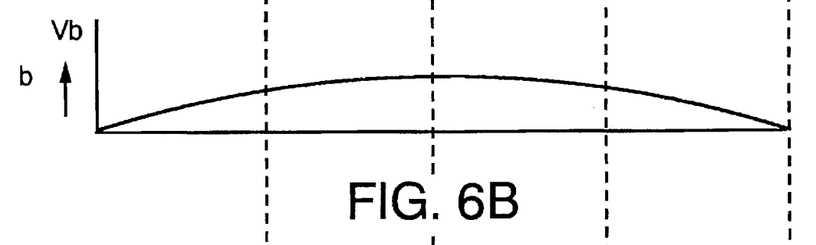
Figure 6C:
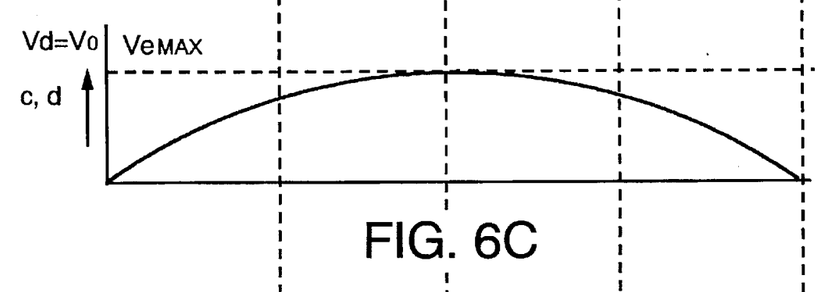
Figure 6E:
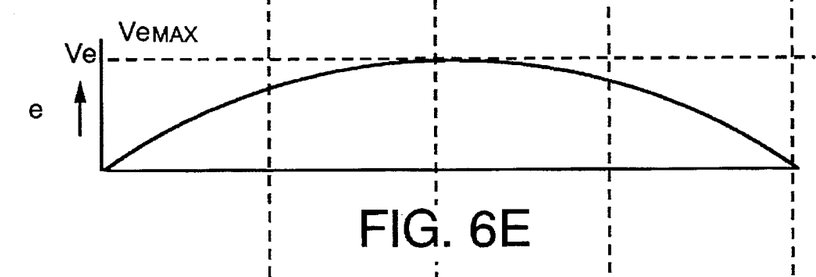
Figure 6G:
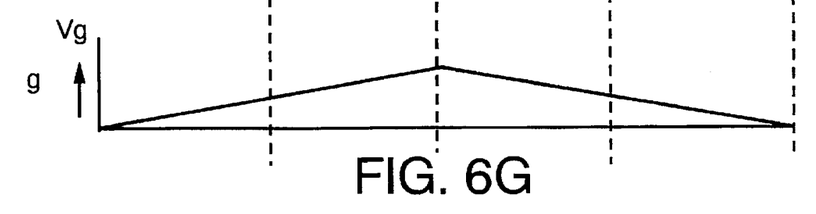

FIG. 5 shows an automatic level control circuit of a third embodiment of the present invention. FIG. 6 shows characteristics of each point (a·g) of the automatic level control circuit of the third embodiment of the present invention. Note that scales of vertical axis in FIG. 6A~FIG. 6G are not the same. An operation of the automatic level control circuit of the third embodiment of the present invention is explained using FIG. 5 and FIG. 6.

A circuit structure of FIG. 5 is obtained by combining the circuit of FIG. 1 and the circuit of FIG. 3. In the third embodiment, FIG. 5 has an advantage where resistor 8 and N channel transistor Q2 are arranged between amplifier 3 and voltage comparator 4, and a parallel circuit consisting of a resistor 10 and an N channel transistor Q3 on the minus side input of voltage comparator 4 is also arranged. In the circuit of the third embodiment 3, gate voltages (FIG. 5G) of N channel transistors Q1, Q2 and Q3 are controlled simultaneously by charging/discharging circuit 5.

A voltage Ve (FIG. 5E) inputted on the minus side input of the voltage comparator 4 is divided by resistance R3 of the resistor 10 and ON-resistance RQ3 of the N channel transistor Q3, and is obtained as shown in the following formula (10):

$$Ve=\{R3/(R3+RQ3)\}\cdot Vref \qquad (10)$$

where, R3 is resistance value of resistor 10 and RQ3 is ON-resistance value of N channel transistor Q3. Voltage comparator 4 operates so that the plus side input voltage and the minus side input voltage become the same value. Thereby, input voltage Vd (=the output voltage Vo) of voltage comparator 4 is represented in the following formula (11).

$$Vd = Ve = \{R3/(R3+RQ3)\} \cdot Vref \quad (11)$$

Input voltage Vi is applied to an input terminal "a" and output voltage Vo of the automatic level control circuit is obtained from the terminal "d" via the first potential divider comprised of resistor 1 and N channel transistor Q1, amplifier 3 and the second potential divider comprised of resistor 8 and N channel transistor Q2. These processes are shown by the following formulas (12)~(14).

The input voltage Vb of amplifier 3 is obtained as follows.

$$Vb = Vi \cdot \{RQ1/(R1+RQ1)\} \quad (12)$$

The output voltage Vc of amplifier 3 is obtained as follows.

$$Vc = Vb \cdot Gv \quad (13)$$

The input voltage Vd of voltage comparator 4 is obtained as follows.

$$Vd = Vo = Vc \cdot \{RQ2/(R2+RQ2)\} \quad (14)$$

For simplification of the formulas, assuming that $RQ1/(R1+RQ1)=X1$, $RQ2/(R2+RQ2)=X2$, and $R3/(R3+RQ3)=X3$, then Vc is obtained from formulas (12) and (13) as follow.

$$Vc = X1 \cdot Vi \cdot Gv \quad (15)$$

Accordingly, formula (16) is obtained from formulas (14) and (15) as follows.

$$Vd = Vo = X1 \cdot X2 \cdot Vi \cdot Gv \quad (16)$$

Alternatively, formula (17) is obtained from formula (11) as follows.

$$Ve = X3 \cdot Vref \quad (17)$$

As illustrated in FIG. 9, the smaller the gate voltage Vg (FIG. 6G) is, the larger ON-resistances RQ1, RQ2, RQ3 of N channel transistors Q1, Q2, Q3 become, respectively, and the larger the gate voltage Vg (FIG. 6G) is, the smaller ON-resistances RQ1, RQ2, RQ3 of N channel transistors Q1, Q2, Q3 become, respectively. Thereby, comparison voltage Ve (FIG. 6E) varies depending on value of gate voltage Vg. The characteristics of such circuit are considered by separating to the following three ranges.

(1) In case of Vi·Gv<Vref, in other words, when R1<<RQ1, R2<<RQ2 and R3<<RQ3 (Vi is a small signal), X1=X2=1 and X3=R3/(R3+RQ3) is obtained, and then value of X3 is determined by giving R3 and RQ3 to the second formula. From formulas (16) and (17), the following formulas Vo=Vi·Gv and also Vo<X3·Vref are obtained. This is because the maximum value of Vd becomes Ve. Then, Vo is obtained such as Vo=0.

(2) In case of Vi·Gv>Vref, R1 is almost equal to RQ1, R2 almost RQ2, and R3 almost RQ3 (Vi is a middle signal), it becomes X1=X2=X3=½. Therefore, from formulas (16) and (17), Vo is substantially obtained such as Vi·Gv/4 and Ve=Vref/2.

(3) In case of Vi·Gv>Vref, and R1>>RQ1, R2>>RQ2, and R3>>RQ3 (Vi is a large signal), then Vo is substantially obtained from the formula (16) such as Vo=Vi·Gv/(R1·R2)

and also Ve is obtained from formula (17) such as Ve=Vref. Therefore, Vo is obtained as a value divided by a product of R1 and R2 in comparison with that of the second embodiment. Further, maximum value of Vo becomes equal to Vref. Accordingly, in the circuit of the third embodiment, it is possible to get more smoothed curve than that of the circuit of the second embodiment.

As described above, the output characteristics of the automatic level control circuit is represented by a curve having a smoothed curve (FIG. 6D). FIG. 6D shows that the output level does not saturate over the range from small signal to large signal and also the output level varies throughout all range in response to the input level. Still, even a large signal may be inputted, the maximum output voltage is restricted to the value of Vref, which, thereby, can prevent the output voltage saturation.

Further, by changing the combination of (R1, RQ1), (R2, RQ2) and (R3, RQ3), characteristics of the curve can be changed.

What is claimed is:

1. An automatic level control circuit for restricting sound level comprising:

a first potential divider comprising a first resistor having an end terminal and a first transistor connected to the first resistor at a connection point, end terminal of said resistor being connected to an input terminal;

an amplifier having an input terminal and an output terminal, said amplifier being connected to the connection point of the first resistor and the first transistor;

a second potential divider comprising a second resistor and a second transistor connected to the second resistor at a connection point, said second potential divider being connected to the output terminal of said amplifier;

a voltage comparator including a positive input terminal connected to a connection point of the second resistor and the second transistor of said second potential divider, and including a negative input terminal connected to a reference voltage, said voltage comparator including an output terminal; and a charging/discharging circuit having an input connected to the output terminal of said voltage comparator, and having an output connected to a gate terminal of the first and second transistors.

2. An automatic level control circuit for restricting sound level comprising:

a first potential divider comprising a first transistor and a first resistor having an end terminal and being connected to the first transistor at a connection point, the end terminal of the resistor being connected to an input terminal;

an amplifier including an input terminal and an output terminal, the input terminal of said amplifier being connected to the connection point of the first resistor and the first transistor of said first potential divider;

a second potential divider including a second resistor, a second transistor, and a voltage reference source, the second resistor being connected to the voltage reference source at a resistor connection point and the transistor being connected to the voltage reference source at a source connection point;

a voltage comparator including a positive input terminal connected to the output terminal of said amplifier, and including a negative input terminal connected to the resistor connection point of the second resistor and the reference voltage source of the second potential divider and said voltage comparator including an output terminal; and a charging/discharging circuit having an input connected to the output terminal of said voltage comparator, and having an output connected to a gate terminal of the first and second transistors.

3. An automatic level control circuit for restricting sound level comprising:

a first potential divider comprising a first transistor and a first resistor having an end terminal and being connected to the first transistor at a first connection point, the end terminal of the resistor being connected to an input terminal;

an amplifier including an input terminal and an output terminal, the input terminal being connected to the first connection point;

a second potential divider comprising a second resistor and a second transistor connected to the second resistor at a second connection point, one end terminal of said resistor being connected to the output terminal of said amplifier;

a third potential divider including a third resistor, a third transistor, and a voltage reference source, the third resistor being connected to the reference voltage source at a third connection point and the third transistor being connected to the voltage reference source at a source connection point;

a voltage comparator having a positive input terminal connected to the second connection point and having a negative input terminal connected to the third connection point, and said voltage comparator having an output terminal; and a charging/discharging circuit having an input connected to the output terminal of said voltage comparator, and having an output connected to a gate terminal of said first, second, and third transistors.

4. The automatic level control circuit for restricting sound level of claim wherein R1, RQ1, R2, RQ2 are combined such as, $$RQ1/(R1+RQ1)=n\{R2/(R2+RQ2)\}$$

and n is changed, where, R1: resistance value of first resistor, RQ1: ON-resistance value of first transistor, R2: resistance value of second resistor, and RQ2: ON-resistance value of second transistor.

5. The automatic level control circuit for restricting sound level of claim 2: wherein R1, RQ1, R3, RQ3 are combined such as, $$RQ1/(R1+RQ1)=n\{R3/(R3+RQ3)\}$$

and n is changed, where, R1: resistance value of resistor, RQ1: ON-resistance value of first transistor, R3: resistance value of second resistor, and RQ3: ON-resistance value of second transistor.

6. The automatic level control circuit for restricting sound level of claim 3:

wherein combinations of RQ1/(R1+RQ1),RQ2/(R2+RQ2) and RQ3/(R3+RQ3) are changed, where, R1: resistance value of first resistor, RQ1: ON-resistance value of first transistor, R2; resistance value of second resistor, RQ2: ON-resistance value of second transistor, R3: resistance value of third resistor, and RQ3: ON-resistance value of third transistor.

* * * * *

UNITED STATES PATENT AND TRADEMARK OFFICE
CERTIFICATE OF CORRECTION

PATENT NO.   : 5,651,073
DATED        : July 22, 1997
INVENTOR(S)  : Isu et al.

It is certified that error appears in the above-indentified patent and that said Letters Patent is hereby corrected as shown below:

Column 10, Line 2, after "claim" insert --1--;

Line 20, after "of" insert --first--.

Signed and Sealed this

Sixteenth Day of December, 1997

Attest:

BRUCE LEHMAN

Attesting Officer

Commissioner of Patents and Trademarks